(12) United States Patent
Ryu

(10) Patent No.: US 8,243,419 B2
(45) Date of Patent: Aug. 14, 2012

(54) CAPACITOR STRUCTURE

(75) Inventor: Yu-Shin Ryu, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 380 days.

(21) Appl. No.: 12/571,769

(22) Filed: Oct. 1, 2009

(65) Prior Publication Data

US 2010/0142119 A1    Jun. 10, 2010

(30) Foreign Application Priority Data

Dec. 9, 2008 (KR) ................ 2008-124533

(51) Int. Cl.
*H01G 4/005* (2006.01)
(52) U.S. Cl. ..... 361/303; 361/311; 361/313; 361/301.4; 361/305; 361/301.2
(58) Field of Classification Search ............ 361/303, 361/301.2, 301.4, 305, 311–313, 321.1, 321.2, 361/306.1, 306.3
See application file for complete search history.

(56) References Cited

U.S. PATENT DOCUMENTS

| 6,297,524 | B1 | 10/2001 | Vathulya et al. |
| 7,645,669 | B2 * | 1/2010 | Hsu et al. ............ 438/257 |
| 2007/0126079 | A1 * | 6/2007 | Shioya et al. ........... 257/532 |
| 2007/0155112 | A1 | 7/2007 | Park |
| 2009/0195963 | A1 * | 8/2009 | Masuda et al. ............ 361/312 |

FOREIGN PATENT DOCUMENTS

| CN | 1411610 A | 4/2003 |
| KR | 10-2002-0020720 | 3/2002 |
| KR | 10-2007-0074441 | 7/2007 |

OTHER PUBLICATIONS

"Capacity Limits and Matching Properties of Integrated Capacitors"—IEEE Journal of Solid-State Circuits, vol. 37, No. 3, Mar. 2002.

* cited by examiner

*Primary Examiner* — Nguyen T Ha
(74) *Attorney, Agent, or Firm* — Morgan, Lewis & Bockius LLP

(57) ABSTRACT

A capacitor structure includes: a first electrode configured to include a plurality of openings; a second electrode formed in each center of the openings; and a dielectric layer formed to surround the second electrode and fill the openings of the first electrode.

20 Claims, 3 Drawing Sheets

CAPACITOR STRUCTURE

CROSS-REFERENCE TO RELATED APPLICATIONS

The present invention claims priority of Korean Patent Application No. 10-2008-0124533, filed with Korean Intellectual Property Office on Dec. 9, 2008, which is incorporated herein by reference.

BACKGROUND OF THE INVENTION

1. Field of the Invention

The present invention relates to semiconductor fabrication technology; and, more particularly, to a capacitor having a metal-oxide-metal (MOM) structure.

2. Description of Related Art

A capacitor embedded in a semiconductor chip is classified into a metal-insulator-metal (MIM) structure, hereinafter, referred to as an MIM capacitor, and a metal-oxide-metal (MOM) structure, hereinafter, referred to as an MOM capacitor. The MIM capacitor requires an additional process to individually form an upper electrode, a lower electrode and an insulator while the MOM capacitor does not need an additional process because it uses a parasitic capacitance between interconnections formed during a back-end of line (BEOL) process.

However, since the MOM capacitor uses the parasitic capacitance subsequent to the BEOL process, it is required to increase a size of the MOM capacitor to gain a high electrostatic capacitance in a unit. Consequently, active devices occupy a large area in a semiconductor chip inevitably, resulting in production cost.

SUMMARY OF THE INVENTION

An embodiment of the present invention is directed to a capacitor structure with high electrostatic capacitance without increasing a size thereof.

In accordance with an aspect of the present invention, there is provided a capacitor structure including a first electrode configured to include a plurality of openings; a second electrode formed in each center of the openings; and a dielectric layer formed to surround the second electrode and fill the openings of the first electrode.

In accordance with another aspect of the present invention, there is provided a capacitor structure including a first electrode configured to include a plurality of first layers, each first layer having at least one opening and vertically coupled to each other through a plurality of first vias to form a cylindrical structure; a plurality of second electrodes configured to include a plurality of second layers corresponding to the first layers, each second layer vertically coupled to each other through a plurality of second vias and formed in the opening of the first electrode; and a dielectric layer formed between the first electrode and the second electrode to surround the second electrode and fill the openings of the first electrode.

DESCRIPTION OF SPECIFIC EMBODIMENTS

Figure 1:
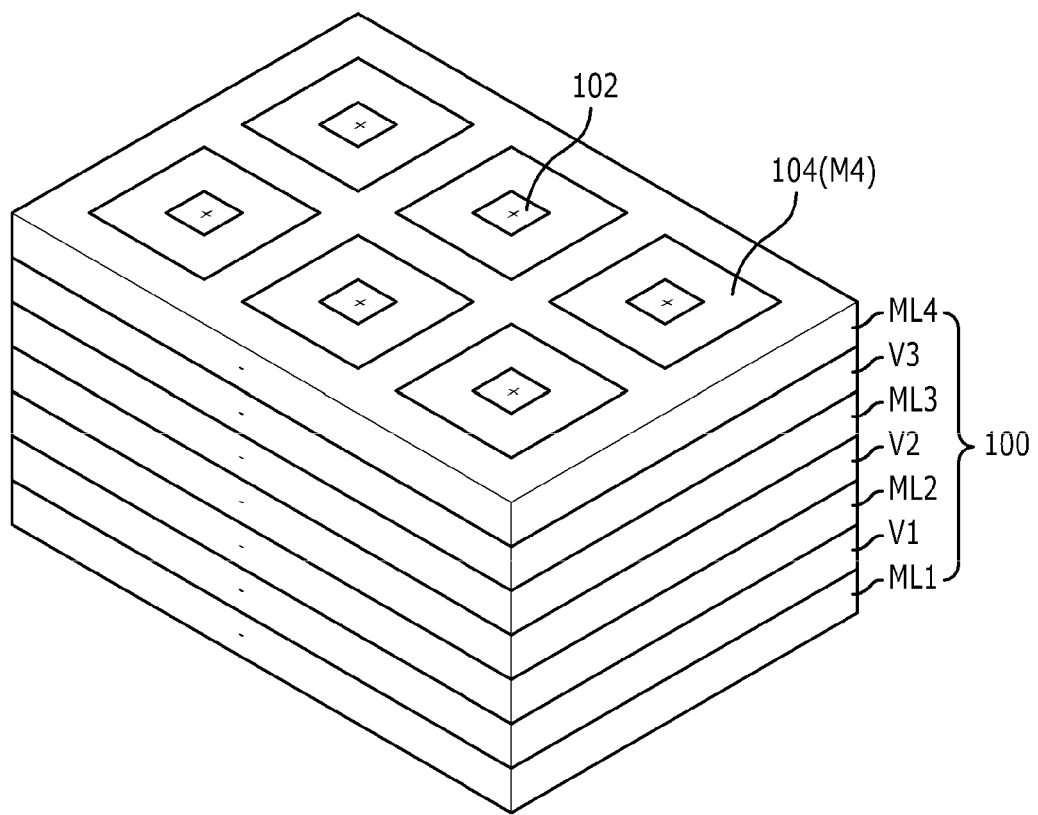
FIG. 1 is a perspective view of a capacitor structure in accordance with an embodiment of the present invention.

The advantages, features and aspects of the invention will become apparent from the following description of the embodiments with reference to the accompanying drawings, which is set forth hereinafter.

In the drawings, the dimensions of layers and regions are exaggerated for clarity of illustration. Like reference numerals in the drawings denote like elements, and thus their description will be omitted. It will also be understood that when a layer (or film) is referred to as being 'on' another layer or substrate, it can be directly on the other layer or substrate, or intervening layers may also be present. Furthermore, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Furthermore, it will also be understood that when an element is 'formed with the same shape', it can be formed with the same as the entire shape except for a width, a thickness and a size.

EMBODIMENTS

Figure 2:
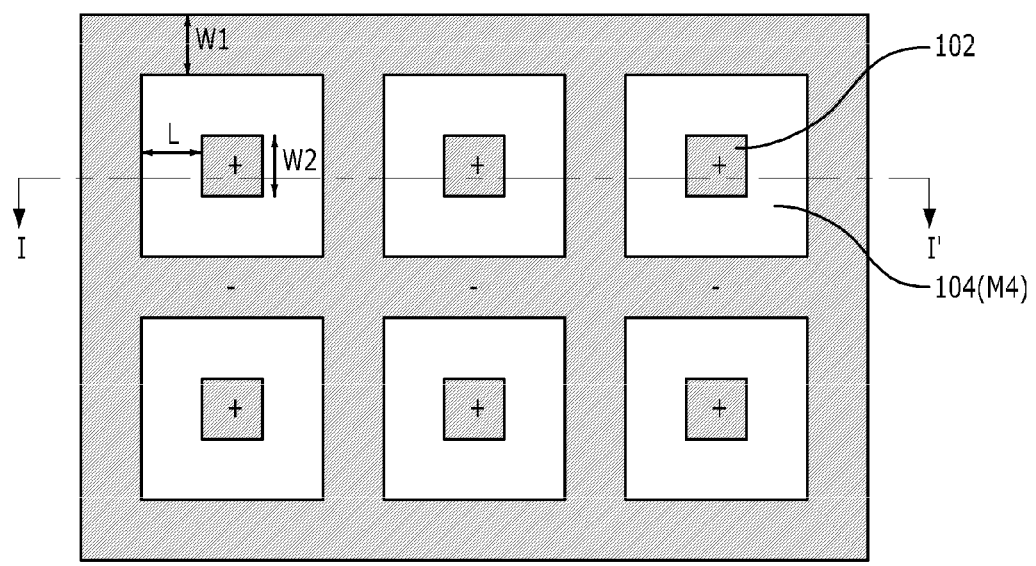
FIG. 2 is a plan view of the capacitor structure shown in FIG. 1.
Figure 3:
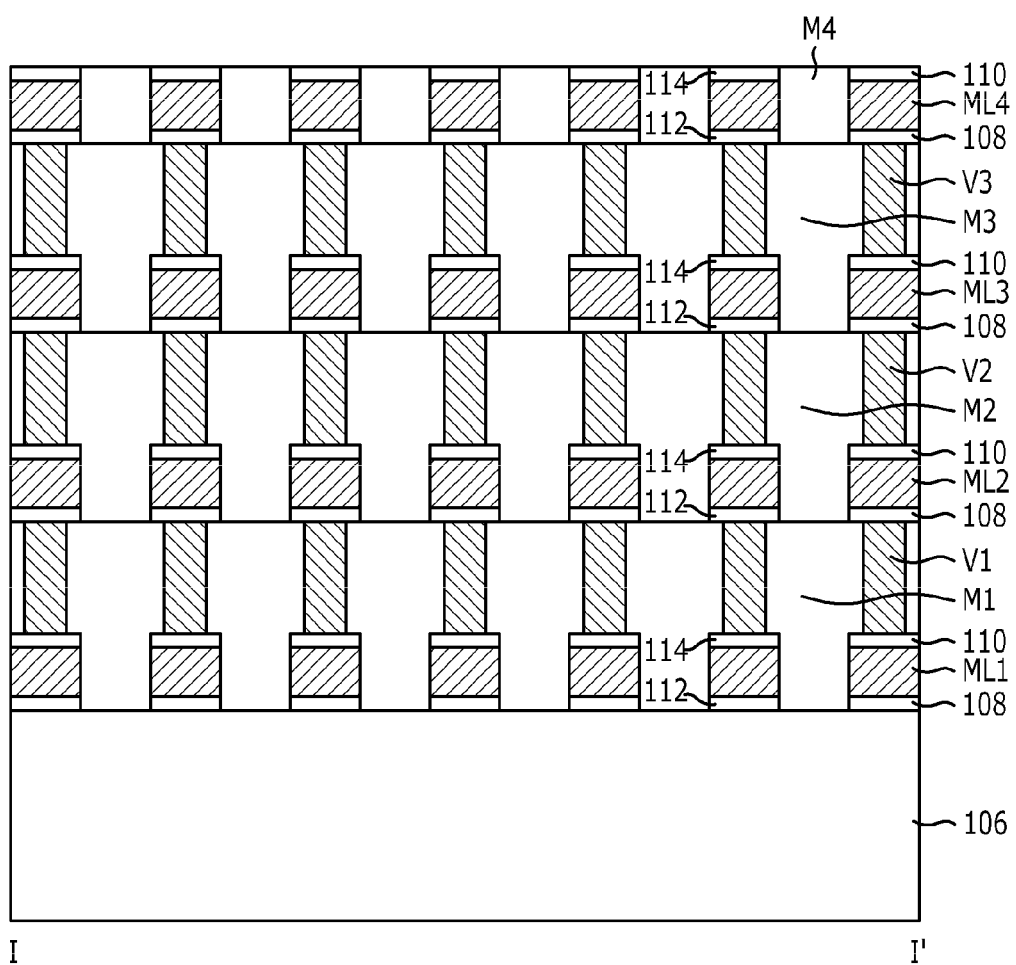
FIG. 3 is a cross-sectional view of the capacitor structure shown FIG. 2 taken along line I-I'.

FIG. 1 is a perspective view of a capacitor structure in accordance with an embodiment of the present invention. FIG. 2 is a plan view of the capacitor structure shown in FIG. 1. FIG. 3 is a cross-sectional view of the capacitor structure shown FIG. 2 taken along line I-I'.

Referring to FIGS. 1 to 3, the capacitor structure in accordance with the present embodiment includes first and second electrodes 100 and 102, and a dielectric layer 104 formed therebetween.

The first electrode 100 includes a plurality of conductive layers ML1 to ML4, each having at least one opening, i.e., one or more openings. The conductive layers ML1 to ML4 of the first electrode 100 have a flat-type structure including a plurality of pillars inside to form a lattice strip type. The conductive layers ML1 to ML4 of the first electrode 100 are formed in substantially the same shape. The conductive layers ML1 to ML4 of the first electrode 100 may be formed in substantially the same size, width and thickness. The conductive layers ML1 to ML4 of the first electrode 100 may be formed to have substantially the same width, or formed to have different size and width. For example, the flat-type structure whose inside is formed with plural pillars to form a lattice strip type includes pillars and borders surrounding the pillars. Each border may have a width greater than that of each pillar. The width of the border may range from approximately 0.1 µm to approximately 1 µm.

The openings of the conductive layers ML1 to ML4 of the first electrode 100 are aligned with each other in a vertical direction. The openings are formed in a shape of a polygon, e.g., triangle, quadrangle, pentagon, hexagon, octagon and the like, a circle, a semicircle and an oval. The openings may be formed in a shape of a square.

Furthermore, a plurality of first vias V1 to V3 are alternately disposed between the conductive layers ML1 to ML4 of the first electrode 100. That is, the conductive layers ML1 to ML4 of the first electrode 100 are vertically coupled to each other through the first vias V1 to V3 so that the conductive layers ML1 to ML4 and the first vias V1 to V3 are alternately disposed within the first electrode 100. As a result, the openings of the conductive layers ML1 to ML4 of the first electrode 100 are coupled to each other so that the first electrode 100 has a cylindrical structure.

The first vias V1 to V3 are disposed between corresponding ones of the conductive layers ML1 to ML4 of the first electrode 100, and have substantially the same shape as the conductive layers ML1 to ML4. For example, like the conductive layers ML1 to ML4, the first vias V1 to V3 may be formed in a flat-type structure having plural pillars inside to form a lattice strip type. Here, the first vias V1 to V3 may be formed to have substantially the same shape as the conductive layers ML1 to ML4 of the first electrode 100, but may have different size, thickness and width from the conductive layers ML1 to ML4. That is, the first vias V1 to V3 may have a width substantially equal to or narrower than that of the conductive layers ML1 to ML4 of the first electrode 100. Also, the first vias V1 to V3 may have a width broader than that of the conductive layers ML1 to ML4 of the first electrode 100. Further, each of the first vias V1 to V3 may be formed with different width and thickness from each other, but have substantially the same shape as the conductive layers ML1 to ML4 of the first electrode 100.

The second electrode 102 includes a plurality of conductive layers ML1' to ML4' corresponding to the first electrode 100. The second electrode 102 is disposed to be apart from the first electrode 100 with a predetermined distance L. The predetermined distance L may range from approximately 0.1 μm to approximately 1 μm. The second electrode 102 is disposed at every opening of the first electrode 100, and coupled to each other through additional metal interconnections. Here, there is not limitation to a structure of each metal interconnection. The metal interconnections are formed in a bar-type or plat-type structure, and electrically isolated from the first electrode 100 through an additional insulator.

The conductive layers ML1' to ML4' of the second electrode 102 have a width substantially the same as that of the first electrode 100. The conductive layers ML1 to ML4 of the first electrode 100 may have a first width W1 ranging from approximately 0.1 μm to approximately 1 μm, and the conductive layers ML1' to ML4' of the second electrode 102 have a second width W2 ranging from approximately 0.1 μm to approximately 1 μm.

Further, a plurality of second vias V1' to V3' are alternately disposed between the conductive layers ML1' to ML4' of the second electrode 102. That is, the conductive layers ML1' to ML4' of the second electrode 102 are vertically coupled to each other through the second vias V1' to V3'. The second vias V1' to V3' are disposed between corresponding ones of the conductive layers ML1' to ML4' of the second electrode 102, and have substantially the same shape as the conductive layers ML1' to ML4' of the second electrode 102. As a result, the second electrode 102 has a bar-type structure where the conductive layers ML1' to ML4' of the second electrode 102 are vertically coupled to each other. Like the openings of the first electrode 100, the second electrode 102 has a shape of a polygon or a circle.

The second vias V1' to V3' may be formed with substantially the same shape as the conductive layers ML1' to ML4' of the second electrode 102, but may have different size, thickness and width from the conductive layers ML1 to ML4. That is, the second vias V1' to V3' may have a width substantially equal to or narrower than that of the conductive layers ML1' to ML4' of the second electrode 102. Also, the second vias V1' to V3' may have a width broader than that of the conductive layers ML1' to ML4' of the second electrode 102. Further, each of the second vias V1' to V3' may be formed with different width and thickness from each other, but have substantially the same shape as the conductive layers ML1 to ML4 of the second electrode 102.

The conductive layers ML1 to ML4 and ML1' to ML4' of the first and second electrodes 100 and 102 are formed with the same materials. Because the conductive layers are simultaneously formed along with interconnections during a back-end of line (BEOL) process for fabricating a semiconductor chip, the conductive layers are formed of metal materials which are used to form the interconnections of the semiconductor chip. For example, all materials used to form the interconnections of the semiconductor chip may be used as the conductive layers. The conductive layers may be formed of aluminum (Al), copper (Cu), or platinum (Pt).

The first and second vias V1 to V3 and V1' to V3' may be formed of the same material using a damascene process. The first and second vias V1 to V3 and V1' to V3' may be formed of the same material as the conductive layers. Specifically, the first and second vias V1 to V3 and V1' to V3' are formed of metal materials. For example, the metal materials may be aluminum (Al), copper (Cu), or platinum (Pt). The first and second vias V1 to V3 and V1' to V3' may be formed of copper (Cu) when the conductive layers are formed of aluminum (Al).

The dielectric layer 104 is formed between the first electrode 100 and the second electrode 102. To be specific, the dielectric layer 104 is formed to fill the openings of the conductive layers ML1 to ML4 in the first electrode 100. The dielectric layer 104 may include any materials having a dielectric constant, and it may include a silicon oxide ($SiO_2$) layer. Besides, the dielectric layer 104 may include metal oxide materials having a high dielectric constant. The metal oxide materials include a hafnium oxide ($HfO_2$) layer, a zirconium oxide ($ZrO_2$) layer, a titanium oxide ($TiO_2$) layer, an aluminum oxide ($Al_2O_3$) layer or a tantalum oxide ($Ta_2O_5$) layer, each having a dielectric constant higher than 3.5.

A first lower barrier metal layer 108 and a first upper barrier metal layer 110 are formed over and below the conductive layers ML1 to ML4 of the first electrode 100. The first lower barrier metal layers 108 form a vertical symmetry with the first upper barrier metal layer 110 on the basis of the conductive layers ML1 to ML4 of the first electrode 100. The first lower and upper barrier metal layers 108 and 110 are formed in substantially the same shape as the conductive layers ML1 to ML4 of the first electrode 100 by simultaneously patterning both of them during an oxidation process. The first lower and upper barrier metal layers 108 and 110 include a titanium nitride (TiN) layer, a tantalum nitride (TaN) layer, a tungsten nitride (WN), a stacked layer of titanium and titanium nitride (Ti/TiN), or a stacked layer of tantalum and tantalum nitride (Ta/TaN).

A second lower barrier metal layer 112 and a second upper barrier metal layer 114 are formed over and below the conductive layers ML1' to ML4' of the second electrode 102. The second lower barrier metal layers 112 forms a vertical symmetry with the second upper barrier metal layer 114 on the basis of the conductive layers ML1 to ML4 of the first electrode 100. The second lower and upper barrier metal layers 112 and 114 are formed with substantially the same shape as the conductive layers ML1 to ML4 of the first electrode 100 by simultaneously patterning both of them during an oxidation process. The second lower and upper barrier metal layers 112 and 114 include a titanium nitride (TiN) layer, a tantalum nitride (TaN) layer, a tungsten nitride (WN), a stacked layer of titanium and titanium nitride (Ti/TiN), or a stacked layer of tantalum and tantalum nitride (Ta/TaN).

A stacked structure of the first and second electrodes 100 and 102 may be implemented by using the damascene process of the first and second vias V1 to V3 and V1' to V3', and the BEOL process of the conductive layers. Dielectric materials of the dielectric layer 104 may include insulation materials used in the damascene process and the BEOL process. The conductive layers ML1 to ML4 and ML1' to ML4' of the first shown in FIGS. 1 and 2. Furthermore, in a unit capacitor forming a cylindrical structure on the basis of each opening of the first electrode 100, the openings of the first electrode 100 have a shape of a polygon or a circle. Thus, the first electrode 100 has a two-dimensional array structure centering around the second electrode 102 disposed at a center of each opening. Accordingly, it is easy to enlarge the electrostatic capacitances.

Hereinafter, the total capacitance of the capacitor having a metal-oxide-metal (MOM) structure (Hereinafter, referring to as an MOM capacitor) in accordance with an embodiment of the present embodiment is compared with that of a conventional MOM capacitor in detail.

Table 1 shows a comparison table between the MOM capacitor of the present embodiment and the conventional MOM capacitor.

TABLE 1

| | | Prior Art | | Embodiment of present invention |
|---|---|---|---|---|
| | Inter-Metal IMD (FSG) dielectric constant | 3.8 | 3.8 | Inter-Metal IMD (FSG) dielectric constant |
| | Inter-VIA IMD (TEOS) dielectric constant | 4.3 | 4.3 | Inter-VIA IMD (TEOS) dielectric constant |
| | metal thickness (μm) (A) | 0.4 | 0.4 | metal thickness (μm) (A) |
| | IMD thickness (μm) (B) | 0.6 | 0.6 | IMD thickness (μm) (B) |
| | metal width (μm) (C) | 0.2 | 0.2 | metal width (μm) (C) |
| | metal space (μm) (D) | 0.21 | 0.21 | metal space (μm) (D) |
| | VIA width (μm) (E) | 0.19 | 0.19 | VIA width (μm) (E) |
| | VIA space (μm) (F) | 0.22 | 0.22 | VIA space (μm) (F) |
| | capacitor length (μm) (G) | 410.2 | 410.2 | capacitor length (μm) (G) |
| | capacitor width (μm) (H) | 410.2 | 410.2 | capacitor width (μm) (H) |
| | capacitor area (μm$^2$) (G * H) | 168264 | 168264 | capacitor area (μm$^2$) (G * H) |
| capacitance by metal | the number of unit capacitors by metal(I) | 1000 | 250000 | the number of unit capacitors by metal(I) |
| | | — | 1.95 | cylindrical capacitors peri. length (J) (2 * π * R) (R = (B/2) + C = 0.31) |
| | capacitors area by metal (μm$^2$) (I * G * A) | 164080 | 194680 | capacitor plate total area (μm$^2$) (I * J * A) |
| | improvement ratio | 1 | 1.19 | improvement ratio |
| capacitance by VIA | the number of unit capacitors by VIA (K) | 1000000 | 250000 | the number of unit capacitors by VIA (K) |
| | | — | 1.98 | cylindrical capacitors peri. length (L) (2 * π * R) (R = (D/2) + E = 0.315) |
| | capacitor area by VIA (μm$^2$) (K * E * B) | 114000 | 296730 | capacitor plate total area (μm$^2$) (K * L * B) |
| | improvement ratio | 1 | 2.60 | improvement ratio | and second electrodes 100 and 102 may be formed using a physical vapor deposition (PVD) process or a chemical vapor deposition (CVD) process.

As described above, in the capacitor structure in accordance with the present embodiment, the first vias V1 to V3 are formed with the same shape of the conductive layers ML1 to ML4 of the first electrode 100, the shape having a flat-type structure whose inside has plural pillars to form a lattice strip type. With the predetermined distance L toward the horizontal direction from the first vias V1 to V3, the second vias V1' to V3' are formed with the same shape of the conductive layers ML1' to ML4' of the second electrode 102. As a result, it is possible to obtain a horizontal electrostatic capacitance between the first and second vias V1 to V3 and V1' to V3' as well as horizontal and vertical electrostatic capacitances between the conductive layers ML1 to ML4 and ML1' to ML4' of the first and second electrodes 100 and 102.

To maximize the horizontal electrostatic capacitance between the first and second vias V1 to V3 and V1' to V3', the first electrode 100 includes a negative (−) electrode, and the second electrode 102 includes a positive (+) electrode as In Table 1, a 'metal' denotes the conductive layers ML1 to ML4 and ML1' to ML4' of the first and second electrodes 100 and 102, and an 'IMD' denotes the dielectric layer 104 as Inter-Metal Dielectric layer. A 'FSG' stands for Fluorinated Silicate Glass, and a 'TEOS' stands for TetraEthyl OrthoSilicate.

Generally, the MOM capacitor includes a first capacitor between the metal interconnections, i.e., the conductive layers ML1 to ML4, and a second capacitor resulting from vias. The second capacitor has a relatively small capacitance in comparison with the first capacitor.

It is assumed that the first capacitor between the metal interconnections has a capacitance to be 1, and the second capacitor resulting from vias has a capacitance to be 1 in the conventional MOM capacitor. As shown in Table 1, in the MOM capacitor in accordance with the exemplary embodiment of the present invention, the first capacitor has a capacitance to be 1.19, and the second capacitor has a capacitance to be 2.6. That is, the MOM capacitor in accordance with the exemplary embodiment has predominant characteristics of a unit electrostatic capacitance in the same area. Even though the second capacitor resulting from vias, which have a relatively small capacitance, is disregarded, the exemplary embodiment of the present invention may improve the unit electrostatic capacitance by approximately 19%. It is possible to maximize an area of the unit capacitor by forming it as a cylindrical structure.

As described above, the present invention forms a plurality of conductive layers (i.e., metal interconnections) functioning as electrodes of a capacitor with a flat-type structure whose inside has plural pillars to form a lattice strip type, and disposes a plurality of vias between corresponding ones of the conductive layers to thereby vertically couple the corresponding conductive layers. As a result, the capacitor structure in accordance with the present invention has a high electrostatic capacitance without increasing a size thereof.

While the present invention has been described with respect to the specific embodiments, it will be apparent to those skilled in the art that various changes and modifications may be made without departing from the spirit and scope of the invention as defined in the following claims.

What is claimed is:

1. A capacitor structure, comprising:
    a first electrode configured to include a plurality of openings;
    a second electrode formed in each center of the openings; and
    a dielectric layer formed to surround the second electrode and fill the openings of the first electrode,
    wherein the first and second electrode comprise a plurality of first layers and second layers, respectively.

2. The capacitor structure of claim 1, wherein the second electrode is apart from the first electrode with a distance ranging from approximately 0.1 μm to approximately 1 μm.

3. The capacitor structure of claim 1, wherein the opening of first electrode has a polygon shape.

4. The capacitor structure of claim 1, wherein the opening of first electrode has a shape of a circle, a semicircle or an oval.

5. The capacitor structure of claim 1, wherein each first layer comprises a continuous flat-type structure.

6. The capacitor structure of claim 5, wherein the flat-type structure includes a plurality of pillars inside to form a lattice strip type.

7. The capacitor structure of claim 1, wherein each first layer comprises at least one opening and vertically coupled to each other through a plurality of first vias.

8. The capacitor structure of claim 1, wherein each second layer is vertically coupled to each other through a plurality of second vias.

9. A capacitor structure, comprising:
    a first electrode configured to include a plurality of first layers, each first layer having at least one opening and vertically coupled to each other through a plurality of first vias;
    a plurality of second electrodes configured to include a plurality of second layers corresponding to the first layers, each second layer vertically coupled to each other through a plurality of second vias and formed in the opening of the first electrode; and
    a dielectric layer formed between the first electrode and the second electrode to surround the second electrode and fill the openings of the first electrode.

10. The capacitor structure of claim 9, wherein the first vias are disposed between corresponding ones of the first layers to have substantially the same shape as the first layers, and the second vias are disposed between corresponding ones of the second layers to have substantially the same shape as the second layers.

11. The capacitor structure of claim 9, wherein the first layers of the first electrode are formed with a flat-type structure including a plurality of pillars inside to form a lattice strip type.

12. The capacitor structure of claim 9, wherein the second electrode includes a bar-type structure.

13. The capacitor structure of claim 9, wherein the second layers of the second electrode are coupled to each other through additional metal interconnections.

14. The capacitor structure of claim 9, wherein the second electrode is apart from the first electrode with a distance ranging from approximately 0.1 μm to approximately 1 μm.

15. The capacitor structure of claim 9, wherein the second electrode is disposed at every opening of the first electrode.

16. The capacitor structure of claim 9, wherein the opening of first electrode has a polygon shape.

17. The capacitor structure of claim 9, wherein the opening of first electrode has a shape of a circle, a semicircle or an oval.

18. The capacitor structure of claim 9, wherein the first vias have a width substantially equal to or narrower than that of the first electrode.

19. The capacitor structure of claim 9, wherein the second vias have a width substantially equal to or narrower than that of the second electrode.

20. The capacitor structure of claim 9, wherein the openings of the first electrode are aligned in a vertical direction.

* * * * *